(12) United States Patent
Fedynyshyn

(10) Patent No.: US 7,622,246 B2
(45) Date of Patent: Nov. 24, 2009

(54) CONTRAST ENHANCING LAYERS

(75) Inventor: Theodore H. Fedynyshyn, Sudbury, MA (US)

(73) Assignee: Massachusetts Institute of Technology, Cambridge, MA (US)

(*) Notice: Subject to any disclaimer, the term of this patent is extended or adjusted under 35 U.S.C. 154(b) by 245 days.

(21) Appl. No.: 11/534,347

(22) Filed: Sep. 22, 2006

(65) Prior Publication Data

US 2008/0076060 A1    Mar. 27, 2008

(51) Int. Cl.
*G03F 7/20* (2006.01)
*G03F 7/095* (2006.01)

(52) U.S. Cl. .................... 430/325; 430/326; 430/272.1; 430/311; 430/339

(58) Field of Classification Search ........................ None
See application file for complete search history.

(56) References Cited

U.S. PATENT DOCUMENTS

| | | | |
|---|---|---|---|
| 4,535,053 A | 8/1985 | West et al. | |
| 4,578,344 A | 3/1986 | Griffing et al. | |
| 4,591,546 A | 5/1986 | West et al. | |
| 4,672,021 A | 6/1987 | Blumel et al. | |
| 4,677,049 A | 6/1987 | Griffing et al. | |
| 4,702,996 A | 10/1987 | Griffing et al. | |
| 4,777,111 A | 10/1988 | Blumel et al. | |
| 4,804,614 A | 2/1989 | Halle | |
| 4,859,789 A | 8/1989 | Griffing et al. | |
| 4,871,646 A | 10/1989 | Hayase et al. | |
| 4,921,321 A | 5/1990 | Weidman | |
| 4,942,113 A | 7/1990 | Trundle | |
| 4,990,665 A | 2/1991 | Griffing et al. | |
| 5,108,874 A | 4/1992 | Griffing et al. | |
| 5,171,656 A | 12/1992 | Sebald et al. | |
| 5,272,036 A | 12/1993 | Tani et al. | |
| 5,330,881 A | 7/1994 | Sidman et al. | |
| 5,391,442 A | 2/1995 | Tsushima et al. | |
| 5,426,160 A | 6/1995 | Bianconi et al. | |
| 5,439,780 A * | 8/1995 | Joshi et al. .................. | 430/296 |
| 5,776,764 A | 7/1998 | Ueta et al. | |
| 5,795,700 A | 8/1998 | Hatakeyama et al. | |
| 5,804,257 A | 9/1998 | Hayashida et al. | |
| 6,025,117 A | 2/2000 | Nakano et al. | |
| 6,066,433 A | 5/2000 | Takemura et al. | |
| 6,344,309 B2 | 2/2002 | Fukushima et al. | |
| 6,479,212 B1 | 11/2002 | Matsuda et al. | |
| 6,759,502 B1 | 7/2004 | Tang et al. | |
| 6,989,428 B1 | 1/2006 | Bianconi et al. | |
| 7,060,637 B2 | 6/2006 | Li et al. | |
| 2004/0043328 A1 | 3/2004 | Lu | |

FOREIGN PATENT DOCUMENTS

JP         1106049        4/1989

OTHER PUBLICATIONS

Rothschild et al Appl.Phys.Lett 55 (13), Sep. 25, 1989, pp. 1276-1278.*
Bianconi, P.A. et al., "Poly(n-hexylsilyne): Synthesis and Properties of the First Alkyl Silicon [RSi]$_n$ Network Polymer," J. Am. Chem. Soc. 110:2342-44 (1988).
Dabbagh, G. et al. "Positive Tone Processing of Plasma Polymerized Methylsilane," SPIE 3333:394-400, Jun. 1998.
Hofer, D.C. et al., "Contrast Enhanced UV Lithography with Polysilanes," SPIE—Advances in Resist Tech. 469:108-16 (1984).
Horn, M.W. et al., "Plasma-Deposited Organosilicon Thin Films as Dry Resists for Deep Ultraviolet Lithography," J. Vas. Sci. Technol. B 8(6):1493-1496 (1990).
Kunz, R.R. et al., "Photo-Oxidation of σ-Conjugated Si-Si Network Polymers," J. Vas. Sci. Technol. A 9(3):1447-51 (1991).
Kunz, R.R. et al., "Polysilyne Resists for 193-nm Excimer Laser Lithography," SPIE—Advances in Resist Tech. & Proc. VIII 1466:218-226 (1991).
Kunz, R.R. et al., "Polysilyne Thin Films as Resists for Deep Ultraviolet Lithography," J. Vac. Sci. Technol. B 8(6):1820-25 (1990).
Miller, R.D., "New Materials for Optical Microlithography," J. Imaging Sci. 31(2):43-46 (1987).
Miller, R.D., "Polysilane High Polymers," Chem. Rev. 89:1359-1410 (1989).
Miller, R.D., "Polysilanes: Radiation Sensitive Materials for Microlithography," Polymer Preprints, Div. Polymer Chem., Am. Chem. Soc. 31(2):252-53 (1990).
Rosilio, C. et al., "Contribution to the Study of Polysilanes for Photolithography," Microelectronic Eng. 6(1-4):399-406 (1987).
Rosilio, C. et al., "Contribution to the Study of Polysilanes for High-Resolution Photolithography," Microelectronic Eng. 8(1-2):55-78 (1988).
Thomes, W.J. et al., "Photobleaching Comparison of Poly(methylphenylsilylene) and Poly(phenylsilyne)," J. Appl. Phys. 96(11):6313-18 (2004).
Uchino, S. et al., "Contrast Enhancement Materials Using Water Soluble Diazonium Salts for g-Line Stepper," Polymeric Materials Sci. & Eng., Proceedings of the ACS Div. of Polymeric Materials Sci & Eng., Washington, DC 55:604-607 (1986).
West, P.R. et al., "Contrast Enhanced Photolithography: Application of Photobleaching Processes in Microlithography," J. Imaging Sci. 30(2):65-68 (1986).
Miller, R.D. et al., Polysilanes: Photchemistry and Deep UV Lithography, Society of Plastic Engineers, Inc., Photopolymers: Principles, Processes and Materials—Regional Technical Conference, Brookfield Center, CT pp. 111-120 (Oct. 30-Nov. 2, 1988).

(Continued)

*Primary Examiner*—Cynthia Hamilton
(74) *Attorney, Agent, or Firm*—Nutter McClennen & Fish LLP; Thomas J. Engellenner; Charlton Shen

(57) ABSTRACT

Contrast enhancing layers and other materials that can be used as a conformal mask over a photoresist are discussed. In particular, methods and compositions are discussed that can be advantageous when performing lithography using short wavelength actinic radiation (e.g., wavelengths below 200 nm, such as 193 nm or 157 nm). For example, contrast enhancing layers that include an organosilicon containing material can be used to enhance the contrast of a pattern formed on an underlying photoresist layer. Silicon containing polymers, oligomers, and other non-polymeric materials can be used as effective CEL materials.

53 Claims, 3 Drawing Sheets

OTHER PUBLICATIONS

Nouveau, A. et al., "Synthesis and Photoresist Properties of Copolymers of Trimethylsilylmethyl Methacrylate and Oximinoketones Methacrylates," Society of Plastic Engineers, Inc., Photopolymers: Principles, Processes and Materials—Regional Technical Conference, Brookfield Center, CT pp. 339-451 (Oct. 30-Nov. 2, 1988).

Peng, C. et al., "The Design of Silicon-Based Polyimide as a Submicron Resolution Directly Imagable Electron Beam Resist," Society of Plastic Engineers, Inc., Photopolymers: Principles, Processes and Materials—Regional Technical Conference, Brookfield Center, CT pp. 373-392 (Oct. 30-Nov. 2, 1988).

Rosilio, C. et al., "Design of Silicon Containing Resists for Deep UV Bilayer Lithography," Society of Plastic Engineers, Inc., Photopolymers: Principles, Processes and Materials—Regional Technical Conference, Brookfield Center, CT pp. 145-155 (Oct. 30-Nov. 2, 1988).

Sezi, R. et al., "Silicon Containing Resists for I-Line and Deep-UV Application," Society of Plastic Engineers, Inc., Photopolymers: Principles, Processes and Materials—Regional Technical Conference, Brookfield Center, CT pp. 133-143 (Oct. 30-Nov. 2, 1988).

ShinEtsuMicroSi Contrast Enhancement Materials pamphlet, Phoenix, AZ (revised Aug. 12, 2003), available at http://www.microsi.com/photolithography/cem.htm (obtained on Apr. 8, 2009).

Umehara, A. et al, "Application of Silicon Polymer as Positive Photosensitive Material," Society of Plastic Engineers, Inc., Photopolymers: Principles, Processes and Materials—Regional Technical Conference, Brookfield Center, CT pp. 121-131 (Oct. 30-Nov. 2, 1988).

* cited by examiner

US 7,622,246 B2

CONTRAST ENHANCING LAYERS

STATEMENT REGARDING FEDERALLY SPONSORED RESEARCH OR DEVELOPMENT

This invention was made with U.S. government support under DARPA/MTO contract no. FA8721-05-C-0002. The government has certain rights in the invention.

FIELD OF INVENTION

The technical field of this invention is directed to lithography and, in particular, treatment of surfaces with compositions capable of enhancing optical contrast.

BACKGROUND OF THE INVENTION

Optical lithography is a standard process for patterning state-of-the-art devices in the semiconductor industry. Extensions of current lithographic techniques to form smaller features, and thus faster processors, are currently being explored. Advanced lithographic schemes currently undergoing research include the use of short wavelength radiation (e.g., wavelengths below 200 nm) to allow patterning of smaller and smaller features on semiconductor substrates such as silicon wafers.

Impediments to utilizing short wavelength radiation in optical lithography include identifying potential compositions that can be effectively utilized as masks with such actinic radiation to form patterns on substrates with acceptable line resolution. Indeed, it is clear that mask compositions (e.g., photoresists) that can be effectively utilized at one wavelength are not necessarily effective at another wavelength.

For example, with respect to the problem of radiation absorption, the development of polyhydroxystyrene based resists was necessary to overcome high absorbance of phenolic polymers, e.g., novolac resists at 248 nm, and enabled the introduction of 248 nm lithography into integrated circuit manufacturing. In a similar manner, new polymer systems are needed to overcome the high 193 nm absorbance of phenolic-based polymers. Two different classes of resists, based on either polyacrylate or polycyclic copolymer compositions, have been developed to provide resists with decreased absorption relative to phenolic-based polymers.

However, due to the high absorbance of polyhydroxystyrene, polyacrylate, and polycyclic copolymer based resists, the use of any of these compositions at very short wavelengths remains problematic unless the coated resist thickness is under 100 nm. This has led to the development of fluorinated polymers as potential resist materials for 157 nm lithography. These examples, among others, show that the effectiveness of resist materials at one wavelength cannot be used to generally show its effectiveness at another remote wavelength.

Even with the development of some photoresists that potentially have appropriate radiation adsorptive properties for lithography, other problems persist. For example, pattern formation on a photoresist conventionally utilizes aerial imaging, which projects an optical image upon a photoresist with contrasting exposure areas to activate portions of the photoresist that are sufficiently illuminated by actinic radiation. Unfortunately, the modulation transfer function of such an aerial image, which quantifies the intensity of the radiation as a function of position, is not a perfect step function, i.e., the light intensity cannot change instantaneously from one finite value to another over an infinitesimally small length scale. As a result, the modulation transform function typically varies continuously, with a steeper slope corresponding with larger potential contrast that can be achieved over a given distance. As smaller and smaller features are desired, without a change in optics or other equipment, the modulation transfer function virtually "flattens," i.e., the change in contrast over a given distance needs to be steeper for smaller and smaller features. When the slope is too shallow, contrast distinctions for line features are difficult to achieve. Thus, line resolution is effectively limited as smaller and smaller features are desired.

Liquid immersion lithography has the potential to provide better line width resolution at a given actinic radiation wavelength. Though it would be potentially advantageous for liquid immersion lithography to utilize the same types of mask compositions as employed in dry lithography, concerns exist regarding the potential leaching of chemicals from the photoresists into the liquid. Such leaching can detrimentally affect the resolution of the optical system by changing the index of refraction of the liquid. Furthermore, leaching can potentially result in optical lens contamination, which, beyond potentially affecting optical performance, can result in time-consuming equipment maintenance or more frequent optics replacement.

Contrast enhancement is another microlithography technique that can extend the practical limits of optical lithography by potentially enhancing the contrast of a pattern formed on a photoresist. A contrast enhancement layer (CEL) is a photobleachable film that can be applied as a conformal mask over a photoresist. The CEL initially has a high absorbance for the actinic radiation exposure wavelength, but becomes more transparent upon accumulated radiation exposure, allowing more of the actinic radiation to pass onto the underlying photoresist. Though some CEL materials have been developed for G-line (436 nm), I-line (365 nm), and broad-band lithography, the development of a CEL at more advanced wavelengths of 248 nm and below has been limited by the inability to find a material that is capable of high initial absorbance, high bleaching rates, and low final absorbance. This is particularly true of wavelengths below 200 nm (e.g., 193 nm and 157 nm).

Accordingly, a need exists for methods and compositions that can improve or enhance the contrast of patterns (e.g., improving line resolution) formed on photoresists using short wavelength lithography (i.e., utilizing actinic radiation with wavelengths below 200 nm).

SUMMARY OF THE INVENTION

Improved methods and compositions that include a contrast enhancing layer (CEL) are disclosed for performing lithography, especially at wavelengths below about 200 nm. The CEL can be coupled to the surface of the photoresist layer, and can include an organosilicon containing material capable of being photobleached by actinic radiation. For example, the CEL can be characterized by a Dill A parameter having a value greater than about 3.0 $\mu m^{-1}$, or greater than about 5.0 $\mu m^{-1}$, when the CEL is exposed to actinic radiation having a wavelength below about 200 nm; and/or a Dill B parameter having a value less than about 3.0 $\mu m^{-1}$, or less than about 2.0 $\mu m^{-1}$, when the CEL is exposed to radiation through a thickness of the CEL upon exposure to actinic radiation. In general, the CEL can be configured to enhance image contrast of an image pattern formed on the photoresist layer, among other potential functions.

In one embodiment, the CEL includes a plasma polymerized organosilicon containing composition. The composition can have an oxygen to silicon ratio lower than that of $SiO_2$ in air when the $SiO_2$ is exposed to an energy fluence of about 3

J/cm², and/or an oxygen to silicon ratio lower than about 0.3. The organosilicon containing composition can include one or more of a plasma polymerized silane, a plasma polymerized silazane, a plasma polymerized silyne, and a plasma polymerized silylamine.

In another embodiment, the CEL includes a polymer (e.g., copolymer) having multiple silicon-silicon bonds, which is capable of being photobleached by actinic radiation. At least a portion of the polymer can be a polysilane, a polysilyne, or a combination of both. Polysilanes can include a plurality of units represented by the following structural formula:

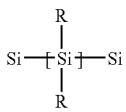

Examples of polysilynes include poly(iso-butylsilyne) and a poly(cyclohexylsilyne). The polysilyne can include a plurality of units represented by the following structural formula:

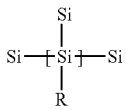

Each R in the above structural formulas can be an independent an organic moiety. For example, the polysilyne units can include at least one of propylsilyne units, butylsilyne units, hexylsilyne units, amylsilyne units, and phenylsilyne units. Accordingly, polysilane or polysilyne units in a polymer can all have the same R group, or can have more than one type of R group.

In another embodiment, the CEL includes a non polymeric organosilicon composition. The organosilicon composition can include a backbone having a plurality of silicon atoms; the backbone can be a linear silicon chain, or a cyclic silicon chain (e.g., as found in dodecamethylcyclohexasilane). One example of an organosilicon containing composition includes a molecule with units according to the following structural formula:

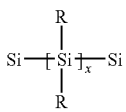

wherein each R is independently an organic moiety, and x is an integer in the range of 2 to 19.

R in any of the structures discussed herein (e.g., with respect to polysilanes, polysilynes, and/or non-polymeric organosilicon compositions) can be an aliphatic or aromatic organic moiety, which is either substituted or unsubstituted. In some embodiments, R is an aliphatic moiety that is optionally substituted. For example, R can be an unsubstituted aliphatic with 1 to 20 carbon atoms, or an unsubstituted fluoroaliphatic moiety. Non-limiting examples of unsubstituted aliphatic moieties include methyl, ethyl, propyl, butyl, pentyl, hexyl, heptyl, octyl, decyl, dodecyl, and tetradecyl. The number of substitutions in a R group can be one or more. The R groups, on one unit or on any number of the units, can all be the same, can all be different, or can have some degree of repetition. Potential substitutions can include one or more of the following including acetal, acyl halide, alcohol, aldehyde, alkane, alkene, alkoxy, alkyne, amide, amine, ammonium, arene, azide, heteroarene, azide, carboxylic acid, disulfide, epoxide, ester, ether, fluoroalcohol, halide, hydroxyl, ketal, ketone, nitrile, nitro, phenol, phosphate, a phosphonate, a phosphinate, sulfide, sulfone, sulfonic acid, sulfonic ester, sulfoxide, silane, silyne, siloxane, thioester, thioketone, and thiol. In another embodiment, R includes a substituted or unstubstituted carbocylic aromatic group. Examples include phenyl, benzyl, tolyl, naphthyl, and anthracyl. R can also include an acid labile protecting group, such as a carboxylic acid, phenol, or a fluoroalcohol.

A CEL can also include a polymer composition for inhibiting cross linking. The polymer composition can also enhance the film forming properties of the CEL. Alternatively, or in addition, the polymer composition can also be configured to increase the water or oxygen permeability of a CEL, or decrease the water or oxygen permeability of a CEL. Examples of polymer compositions include at least one of poly(methacrylate) polymers such as poly(methylmethacrylate) and poly(t-butylmethacrylate), poly(acrylate) polymers, siloxane polymers, fluoropolymers, and fluorosiloxane polymers.

Other embodiments are directed toward methods of enhancing the image contrast of a pattern formed on a photoresist. In such methods, a photoresist layer, capable of being patterned by radiation having a wavelength below about 200 nm, can be formed on a substrate. A CEL can be coupled to the photoresist layer. The CEL can include any of the CEL compositions discussed herein such as an organosilicon containing material that is photobleachable by exposure to actinic radiation. The organosilicon containing material can include one or more of polysilanes, polysilynes, plasma polymerized organosilicon compositions, and non-polymeric organosilicon compositions. The CEL can also be described by its bleaching properties (e.g., changing its film absorbance by at least about 3 µm⁻¹ when exposed to a dosage of actinic radiation having a wavelength of 200 nm or smaller). An image pattern can be exposed on a surface of the CEL with actinic radiation having a wavelength below about 200 nm (e.g., at a wavelength of about 193 nm or about 157 nm) to thereby bleach the CEL. The step of exposure can be performed as a step of a liquid immersion lithographic process (e.g., the exposure is performed in the presence of a liquid contacting the CEL surface). In such an instance, the CEL can also effectively act to inhibit contact between the liquid and the photoresist. A corresponding pattern can be formed on the photoresist layer with enhanced image contrast relative to directly exposing the actinic radiation image pattern on the photoresist layer. The CEL can be subsequently removed after the image pattern is exposed.

BRIEF DESCRIPTION OF THE DRAWINGS

The invention will be more fully understood from the following detailed description taken in conjunction with the accompanying drawings (not necessarily drawn to scale), in which.

DETAILED DESCRIPTION OF THE INVENTION

Embodiments of the invention are directed to methods and materials for enhancing the contrast of a projected image pattern. In the context of lithography, a material layer can be coupled to a photoresist surface (e.g., applied over the photoresist to effectively form a conformal mask). Patterning on the photoresist is performed by projecting the image pattern on the material layer. Such a layer can act as a contrast enhancing layer (CEL) that enhances the contrast of the resulting pattern formed on the photoresist when an actinic radiation image pattern is applied on the CEL and the CEL photobleaches. Note that these embodiments are distinct from the situation when the material layer is itself a photoresist; here the combination of the material layer and a separate photoresist can act in conjunction to provide a better performing lithographic composition than if the photoresist is used alone. Alternatively or in addition, the material layer can act as a barrier layer that can inhibit contact between the photoresist and a liquid layer that is utilized in a liquid immersion lithography technique. In one aspect of the invention, the material layer can include one or more organosilicon containing materials.

It is surprisingly found that organosilicon containing materials can effectively enhance pattern contrast on an underlying photoresist when performing lithography with radiation at short wavelengths (e.g., below 200 nm). Generally, the photobleaching properties of materials can vary substantially with a change in actinic radiation wavelength, and it is unpredictable whether beneficial photobleaching properties of a material at one wavelength will result in beneficial properties at another. For example, particular diazo-based compounds exhibit substantial photobleaching at 248 nm, but can become poor photobleaching materials at 193 nm, as evidenced by the experimental results shown herein. Other potential benefits of using a CEL include increasing focus latitude, increasing exposure latitude, reducing linewidth change over steps, extended resolution, more vertical resist profiles, increasing develop latitude, reduced proximity and interference effects, and increasing integrity in high aspect ratio features.

Methods for Enhancing Pattern Contrast

Figure 1A:
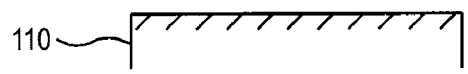
FIGS. 1A-1G depict side views of various stages of a method for utilizing a contrast enhancing layer to enhance the contrast of an image pattern formed on a photoresist in accord with an embodiment of the invention.
Figure 1E:
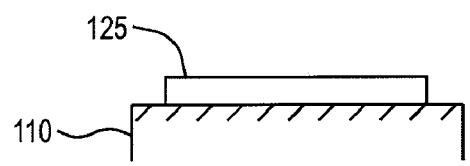
Figure 1B:
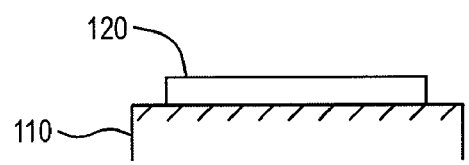

One exemplary embodiment is depicted in FIGS. 1A-1G, showing depictions of various steps of a method for enhancing the pattern contrast on a photoresist in the context of etching a semiconductor substrate. As depicted in FIG. 1A, a surface of a substrate 110, such as a silicon wafer, is prepared for processing. Preparation can include particular cleaning, rinsing, drying, and/or other surface treatments such as adding a surface composition to adjust interfacial properties between the substrate and a photoresist. Next, a photoresist 120 is formed as a layer on the substrate 110 as shown in FIG. 1B. Formation of the photoresist layer can be performed using any number of techniques known to those skilled in the art such as spin casting. In some aspects, the thickness of the photoresist layer is less than about 100 nm. Such photoresist configurations may be advantageous for short wavelength lithography (e.g., less than 200 nm such as 193 nm and/or 157 nm). Thicker layers, however, can also be utilized. Various types of photoresists, appropriate for an actinic radiation to be used, can be employed. For example, when performing lithography at 193 nm, commercially available photoresist compositions such as polymethacrylate compositions available from Rohm and Haas Electronic Materials, Fuji Photo Film, AZ Electronic Materials, Tokyo Ohka Kogyo Co., JSR Micro, Shin-Itsu MicroSi, and Sumitomo Chemical can be utilized.

Figure 1F:
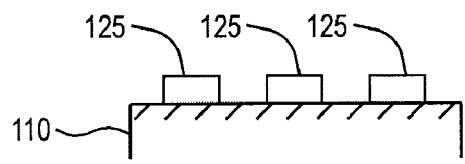
Figure 1C:
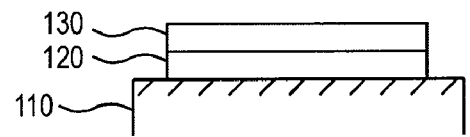

Next a contrast enhancing layer (CEL) 130 is coupled to the photoresist 120 as shown in FIG. 1C. The CEL 130 can act as a conformal mask over the photoresist 120. A CEL can be applied using any number of techniques such as spin casting a liquid formulation on the photoresist, followed by a drying process. A post apply bake step can also be performed (e.g., on a hot plate) subsequent to CEL composition application on the photoresist to help form the final CEL. Types of CEL compositions include organosilicon containing compositions, as described herein, among others.

Figure 1G:
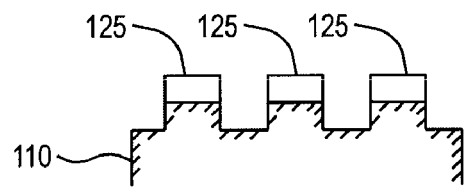
Figure 1D:
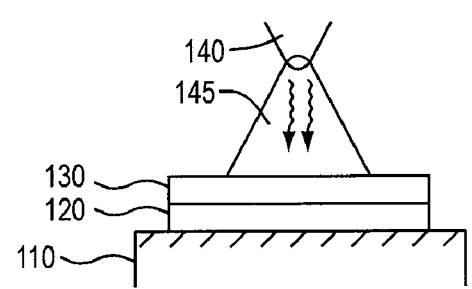

An aerial image pattern can be exposed on the surface of the CEL 130 using actinic radiation 145 emitted from a radiation source 140 as depicted in FIG. 1D. The aerial image pattern can act as an effective mask to provide high illumination certain regions (i.e., clear areas), while providing lower to zero illumination to other areas (i.e., gray or dark areas). The wavelength of the radiation is dictated by the composition of the various materials and the resolution of the pattern sought to be imparted on the photoresist. Though the CEL and photoresist compositions revealed in the present application can be used at many different wavelengths (e.g., wavelengths above 200 nm such as 248 nm and/or 365 nm), some embodiments of the invention are directed to methods of exposing such compositions to short wavelength actinic radiation. For example, the actinic radiation can comprise, or be excluded to, wavelengths that are substantially at, or below, about 200 nm. In a second example, the actinic radiation can comprise, or consist essentially of, a wavelength of about 193 nm, which can be generated by argon fluoride excimer lasers for example. In a third example, the actinic radiation can comprise, or consist essentially of, a wavelength of about 157 nm, which can be generated by molecular fluorine lasers for example.

When the aerial image is incident upon the CEL, the regions of highest intensity, corresponding to the "clear" areas of the mask, are bleached at a faster rate than the lower intensity "dark" areas on the mask. As the CEL accumulates actinic radiation exposure at a particular position, the absorbance of the CEL drops, increasing its transmittance of the radiation. If the CEL bleaching dynamics are such that the CEL has a sufficiently high early absorption, and the CEL and photoresist have sufficiently matched photospeeds, it is possible to substantially expose the underlying photoresist in the clear areas before the CEL is bleached through in the dark areas. Thus, during actinic radiation exposure, the CEL's photobleaching dynamics act as an in-situ contrast mask for the photoresist. The net effect is a higher contrast level of the aerial image used to expose the photoresist.

Accordingly, some embodiments of the invention are directed to methods of enhancing image contrast on a photoresist using a CEL configured such that the absorbance of actinic radiation of the CEL changes by at least about 3 $\mu m^{-1}$, at least about 5 $\mu m^{-1}$, or at least about 10 $\mu m^{-1}$ between the unexposed CEL and some other exposure level (e.g., at or above about 1 $J/cm^2$); the experimental results discussed herein provide some examples of such a CEL. The actinic radiation can be short wavelength radiation (e.g., less than about 200 nm, such as about 193 nm or about 157 nm). Since some CELs can become difficult to remove after overexposure to a particular wavelength, or range of wavelength, of actinic radiation (as discussed herein), a CEL can be configured to decrease its absorbance by at least about 3 µm$^{-1}$, at least about 5 µm$^{-1}$, or at least about 10 µm$^{-1}$ before the CEL becomes overexposed to radiation such that the CEL exhibits negative solubility with a typically compatible developer/remover. As well, the thickness of the CEL can be chosen such that the absorbance over an entire thickness dimension of a CEL, or on average, drops by at least about 3 µm$^{-1}$, at least about 5 µm$^{-1}$, or at least about 10 µm$^{-1}$ upon actinic radiation exposure before the CEL exhibits the negative solubility behavior.

After exposing the CEL to an image pattern, the CEL can be removed as depicted in FIG. 1E. Removal can be effected by a variety of techniques such as exposure to an appropriate solvent and/or developer, depending upon the nature of the CEL composition. Another potential removal technique entails exposing a plasma to the exposed CEL to remove the layer, which can be useful with CEL materials that are substantially cross linked (e.g., plasma polymerized organosilicon materials or silicon containing polymers that have been cross linked by surpassing an energy exposure threshold). A post-exposure bake step can also be applied to the photoresist, either before or after CEL removal. Next, portions of the photoresist receiving substantial exposure from the actinic radiation can be subsequently removed, leaving complementary portions of the photoresist 125 coupled to the substrate 110 as depicted in FIG. 1F. Removal can be effected by use of an appropriate solvent such as a developer formulated to dissolve exposed photoresist after contact for a predetermined period of time, or any other techniques known to those skilled in the art. In an alternative embodiment, the removal of the CEL and select exposed portions of the photoresist can be achieved simultaneously with a single removal step (e.g., use of an appropriate solvent). In such a circumstance, the post-exposure bake can be performed before removal of the CEL and exposed photoresist, if desirable.

After removal of the exposed photoresist areas, lithographic steps for etching exposed portions of the substrate 110 can be performed to create desired features on the substrate 110 as depicted in FIG. 1G. Such lithographic steps are well understood by those skilled in the art.

Figure 2:
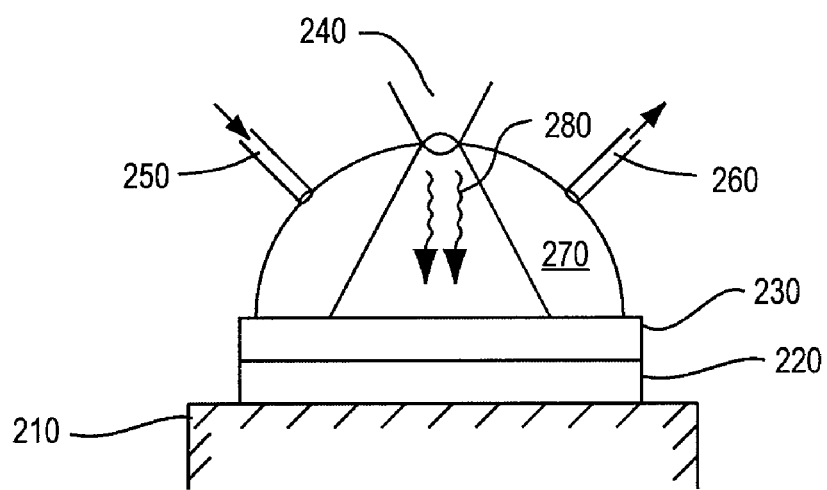
FIG. 2 depicts a side view of a liquid immersion lithography step in accord with embodiments of the invention.

Another embodiment is directed to liquid immersion lithography using one or more aspects of the present invention. As depicted in FIG. 2, a substrate 210 has a photoresist 220 formed thereon, with a material layer 230 coupled to the photoresist. Formation of the photoresist and material layers can be performed in accordance with appropriates steps as discussed herein with respect to CELs. A liquid layer 270 can contact a portion of the surface of the material layer 230 (e.g., about 5 cm$^2$ to about 10 cm$^2$) and the radiation source 240. The liquid can be distributed through a outlet port 250 and sucked into an inlet port 260 as depicted in FIG. 2, though other ways of forming and maintaining the liquid layer can also be utilized as understood by those skilled in the art. An image pattern can be projected through the liquid layer 270, and onto the surface of the material layer 230 using actinic radiation 280. Subsequently, the liquid 270 can be removed, with the material layer and exposed sections of the photoresist also being removed using techniques discussed herein and known to those skilled in the art.

The use of the liquid layer can act to increase the line width resolution achieved by a particular actinic radiation wavelength relative to "dry" lithography. For example, when implemented at about 193 nm, liquid immersion lithography could provide similar resolution as "dry" 157 nm. In dry lithography, the largest numerical aperture (NA) possible is 1.0, which is defined in part by the refractive index of air being 1.0. In liquid immersion lithography, a fluid is introduced between the last optical element and the photoresist. Thus, the NA of the projection optics is effectively increased to above 1.0. For example, the 193 nm refractive index of high-purity water is 1.44, and this is therefore the upper limit of the NA using water at 193 nm. Viewed another way, the vacuum wavelength of 193 nm is reduced by the refractive index of water to an effective wavelength of 134 nm in the image plane. This value is less than 157 nm, implying that a higher resolution is possible with 193 nm and water immersion than with dry 157 nm. A similar reduction in effective wavelength could be possible employing an liquid immersion lithographic system at 157 nm.

In some aspects, the material layer 230 can act to increase the contrast of a pattern formed on the photoresist 220 as described above (i.e., acting as a CEL). In another aspect, the material layer 230 can, in addition or alternatively, act as a barrier layer to inhibit or prevent contact between the liquid layer 270 and the photoresist 220. As a barrier layer, the material layer 230 can inhibit or prevent photoresist from solubilizing and intermingling with the liquid, which can potentially contaminate the liquid 270 (thereby changing its optical properties) and/or the lens of the radiation source 240.

Contrast Enhancing Layer Compositions

Some embodiments of the invention are directed to contrast enhancing layers (CELs) comprising an organosilicon containing material. Such materials can include polymers, oligomers, and/or non-polymeric materials having one or more silicon-silicon bonds. While not necessarily being bound to any particular theory, it is believed that the photobleaching properties of such materials are triggered by the photooxidation of the silicon-silicon bond, as exemplarily depicted by the photooxidation of a polysilane bond shown below:

The silicon-silicon bond is highly absorbing at lithographic wavelengths from about 150 nm to about 250 nm (including about 157 nm, about 193 nm, and about 248 nm). For example, at about 193 nm it is believed that the silicon-silicon bond has an absorbance greater than 10 µm$^{-1}$. The silicon-oxygen-silicon bond, however, is believed to have a substantially lower absorbance—somewhere in the neighborhood of 2 µm$^{-1}$ or less. Accordingly, after exposure to an appropriate wavelength of actinic radiation, the CEL can be photobleached from a high-absorbance material to a low absorbing (e.g., relatively transparent) material. This CEL bleaching phenomena can work in conjunction with the photoactivation properties of the coupled photoresist to help increase the pattern contrast that is eventually transferred to the photoresist by the image pattern of the actinic radiation.

In general, the optical properties of a CEL can be characterized by a film absorbance, $A_\lambda$, (having units of reciprocal length), at a particular wavelength, $\lambda$, given by the Dill model:

$$A_\lambda = A \exp(-EC) + B$$

wherein A is the film's bleachable absorbance given in units of reciprocal length (e.g., µm$^{-1}$); B is the film's non-bleachable absorbance given in units of reciprocal length (e.g., µm$^{-1}$); C is the kinetic photobleaching energy density given in units of area per unit energy (e.g., cm$^2$/mJ); and E is the film exposure dosage given in units of energy per unit area (e.g., mJ/cm$^2$). The values of $A_\lambda$, A, and B are on a natural logarithmic basis. Accordingly, a film's maximum unbleached absorbance for a given wavelength λ is the sum of A and B, with B being the absorbance after substantially full energy dosing (i.e., the energy dosing is sufficient that the exponential term is much smaller than B such as when EC≧about 3). The optical properties of the CEL can also be characterized by the film's optical density, which is defined as the total absorbance (Dill A+Dill B) multiplied by the film thickness.

Embodiments of the invention include CELs having a composition that is photobleachable upon exposure to actinic radiation. Some embodiments utilize a CEL having organosilicon containing materials, in which the CEL has a film absorbance for short wavelength radiation (e.g., wavelengths below about 200 nm, such as about 193 nm and about 157 nm) that follow the Dill model with A being greater than about 3 μm$^{-1}$, greater than about 5 μm$^{-1}$, or greater than about 10 μm$^{-1}$. Alternatively, or in addition, B has a value less than about 3 μm$^{-1}$ or less than about 2 μm$^{-1}$. Alternatively, or in addition, C has a value greater than about 0.001 cm$^2$/mJ or greater than about 0.01 cm$^2$/mJ. Any of the embodiments discussed can include the limitation that CEL has a thickness such that the change in absorbance, or any of the Dill parameters, occurs over substantially the whole thickness of the CEL.

Particular examples of organosilicon containing materials that can be utilized in a CEL include a variety of polymers, oligomers, and/or other non-polymeric materials. As utilized within the present application, the term "polymer" refers to a molecule comprising repeat units, wherein the number of repeat units in the molecule is 20 or greater. Repeat units can be adjacently connected, as in a homopolymer. The units, however, can be assembled in other manners as well. For example, a plurality of different repeat units can be assembled as a copolymer. If A represents one repeat unit and B represents another repeat unit, copolymers can be represented as blocks of joined units (e.g., A-A-A-A-A-A . . . B-B-B-B-B-B . . . ) or interstitially spaced units (e.g., A-B-A-B-A-B . . . or A-A-B-A-A-B-A-A-B . . . ), or randomly arranged units. In general, polymers include homopolymers, copolymers (e.g., block, inter-repeating, or random), cross-linked polymers, linear, branched, and/or gel networks, as well as polymer solutions and melts. In one embodiment of the invention, the polymer comprises at least a portion of a backbone (linear or branched) having a series of silicon-silicon bonds (e.g., at least 20 silicon atoms bonded adjacent to one another in a linear or branched configuration).

Embodiments of a composition that can be used as a CEL material include a polymer comprising polysilane units. Polysilane units generally have a silicon atom bonded to two other silicon atoms and two non-silicon atoms. One example of a polysilane unit is represented by Structural Formula (I):

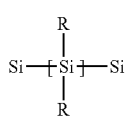

(I)

the unit being captured between the brackets, where each occurrence of R is independently an organic-containing moiety. Since each R is independent, each R can be a distinct moiety or all occurrences of R can be the same—either on a particular unit or on some or all of the units, for example. One or more polysilane units can be arranged as a polymer, as previously discussed. For example, units can also be arranged as a copolymer such as poly(phenyl methyl-co-dimethyl silane). Polysilane units can be intermixed with other polymeric units that are not related to polysilanes to produce mixed copolymers such as a poly(silane-methylmethacrylate) copolymer.

As previously mentioned, each occurrence of R is independently an organic-containing moiety. The organic-containing moiety can be aliphatic or aromatic or a combination of both. In one embodiment, R can be hydrogen or can include 1 to 20 carbon atoms. When R includes an aliphatic group, the group can be branched or linear or cyclic (e.g., having five, six, seven, or eight members, and being optionally fused to one or more other rings). Non-limiting examples of R containing an aliphatic group include methyl, ethyl, propyl, butyl, pentyl, hexyl, heptyl, octyl, decyl, dodecyl, and tetradecyl. Such groups can be linear (e.g., n-butyl), branched (e.g., t-butyl or iso-butyl), or cyclic (e.g., cyclohexyl, and methylcyclohexyl). The aliphatic group can be completely saturated, or include one or more units of unsaturation. The aliphatic group can also carry one or more substituents, as described herein. In addition, the group can include one or more positions where a carbon atom is substituted by a heteroatom such as sulfur, nitrogen, or oxygen.

When R includes one or more aromatic groups, the aromatic group can include carbocyclic aromatic groups such as phenyl, benzyl, tolyl, naphthyl, and anthracyl. Other aromatic groups include heterocyclic aromatics such as imidazoyl, thienyl, furanyl, pyrrolyl, pyridyl, pyrimidyl, pyridazinyl, pyrazolyl, pyrazinyl, thiazolyl, tetrazoylyl, and oxazolyl. Aromatic groups can also include fused polycyclic aromatic rings systems in which a carbocyclic aromatic ring or heteroaryl ring is fused to one or more other rings, either aromatic or non-aromatic (e.g., carboalkyl or heterocyclic). Examples include tetrahydronaphthyl, 2-benzothienyl, 3-benzothienyl, 2-benzofuranyl, 3-benzofuranyl, 2-indolyl, 3-indolyl, 2-quinolinyl, 3-quinolinyl, 2-benzothiazolyl, 2-benzooxazolyl, 2-benzimidazolyl, 1-isoquinolinyl, 1-isoindolyl, 3-isoindolyl, acridinyl, 3-benzisoxazolyl, and the like. As well, multiple aromatic groups can be used in R (e.g., R can include a biphenyl group). Any of the aromatic groups previously described can also include one or more substituents as described herein. Furthermore, aromatic groups can be connected to a silicon backbone via an aliphatic group, as described above (e.g., the aliphatic group can be a saturated linear, branched, or cyclic hydrocarbon having 1 to 10 carbon atoms such as a phenylethyl group).

In general, one or more substitutions can be included with any particular R group. Non limiting examples of organic functional groups that can act as substitutions include acetal, acyl halide, alcohol, aldehyde, alkane, alkene, alkyne, alkoxy, amide, amine, ammonium, arene, azide, heteroarene, azide, carboxylic acid, disulfide, epoxide, ester, ether, fluoroalcohol, halide (including fluorine, chlorine, bromine, and iodide), ketal, ketone, nitrile, nitro, phenol, phosphate, a phosphonate, a phosphinate, sulfide, sulfone, sulfonic acid, sulfonic ester, sulfoxide, silane, silyne, siloxane, thioester, thioketone, or thiol. Substituents can also be multifunctional, such as being a halo-substituted alcohol (e.g., fluoroalcohol) or a halo-substituted alkyl (e.g., trifluoropropyl and nonafluorohexyl).

R can also contain an acid labile protecting group, which when removed generates an acidic proton. Examples include carboxylic acids, phenol, and fluoroalcohols.

The choice of R can alter the properties of the CEL in terms of its processing and/or its action when impinged by radiation. For example, the use of R groups where R includes an aliphatic or aromatic carboxylic or sulfonic acid containing group can be advantageous for forming a CEL having desirable solubility in basic photoresist developers (i.e., the developer can potentially remove both the photoresist and the CEL with one application). Other choices for R affect the bleaching properties of the CEL. In one embodiment, more than half the bonding in a R moiety, or substantially all of the moiety, is aliphatic. Such an embodiment can be useful for lithography using actinic radiation including a wavelength of 193 nm since such materials can exhibit low residual absorbance after energy exposure (i.e., low B values in the Dill model). In another embodiment, more than half the substitutions of a R moiety, or substantially all of the R moieties, are fluoroaliphatic. Such an embodiment can be useful for lithography owing to low residual absorbance after exposure to actinic radiation including 157 nm wavelength radiation. Accordingly, substitutions of R groups can include fluoroaliphatic groups in some embodiments that can be used with actinic radiation including 157 nm wavelength.

Another type of polysilane unit is represented by Structural Formula (IIa):

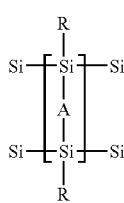

(IIa)

where R is defined as described herein for Structural Formula (I0, and A is a covalent bond or a bivalent organic connecting group. Bivalent connecting groups include alkylidenes (e.g., methylidene, ethylidene, and isopropylidene), alkylenes (e.g., ethylene, propylene, and triethylene), and arylenes (e.g., phenylene, biphenylene and naphthylene). These types of polysilane units are discussed in U.S. Pat. No. 6,025,117, the entire contents of which is incorporated herein by reference. More generally, such units can be described by Structural Formula (IIb):

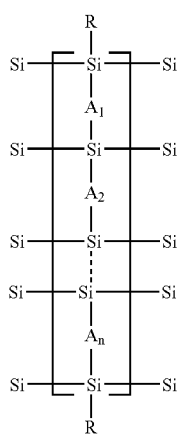

(IIb)

wherein each of $A_1, A_2, \ldots A_n$ is independently a bivalent connector group as described for Structural Formula (IIa), and each R is independently a group as described for Structural Formula (I). n can range from 1 to 10, or more preferably from 1 to 3.

Non-limiting examples of polysilanes include those described in Miller, R. D. et al., Polysilane High Polymers, *Chem. Rev.* 1989, Vol. 89, 1359-1410, which is hereby incorporated herein by reference in its entirety. Some specific polysilanes include those including repeat units according to Structural Formula (I), where one R is methyl and the other R is one of n-Pr, Ph-$C_2H_4$, n-Bu, n-Hex, n-dodecyl, c-Hex, Ph, p-tolyl, p-t-butyl $C_6H_4$, 2,4,5 $Me_3C_6H_2$, p-MeO$C_6H_4$, p-n-$C_8H_{17}$O$C_6H_4$, 3-OHC$_6H_4$CHMeCH$_2$, p-MeO$C_6H_4$(CH$_2$)$_3$, p-Me$_2$N$C_6H_4$, p-(tetramethylsilyl)$C_6H_4$, p-(tetramethylsilyl)CH$_2$C$_6$H$_4$, 2-3(3-cyclohexenyl)ethyl), β-naphthyl, p-biphenyl, cyclohexyl. Other polysilanes include units according to Structural Formula (I) where both R groups of a unit are n-Pr, n-Bu, n-pentyl, n-Hex, n-heptyl, n-octyl, n-decyl, n-dodecyl, n-tetradecyl, p-n-Bu-$C_6H_4$, p-n-Hex-$C_6H_4$, p-i-Bu-$C_6H_4$, m-n-Hex $C_6H_4$, p-n-BuO-$C_6H_4$, or m-n-BuO-$C_6H_4$. Still other polysilanes include units having Structural Formula (I) where R1 and R2 in Table 1 are each one of the R groups.

TABLE 1

| Exemplary Polysilane Parameters | |
|---|---|
| R1 | R2 |
| hydrogen | phenyl |
| p-n-Bu—$C_6H_4$ | p-n-BuO—$C_6H_4$ |
| p-n-BuO—$C_6H_4$ | m-n-BuO—$C_6H_4$ |

Another embodiment of a composition that can be used in a CEL material is a polymer comprising polysilyne units. A polysilyne unit can have a chemical structure represented by Structural Formula (III):

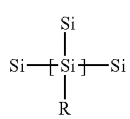

(III)

where each occurrence of R is independently an organic-containing moiety. R can include any of the groups described for Structural Formula (I). As well, the polymer that comprises polysilyne units can include homopolymers, copolymers (mixing different polysilyne units such as units having R=iso-butyl with units having R=n-propyl, and/or polysilyne units with other silicon-containing or non-silicon-containing units), etc. as previously described. Examples of polysilynes include those described in U.S. Pat. No. 4,921,321; Kunz, R. R. et al., Polysilyne resists for 193-nm excimer laser lithography, SPIE Advances in Resist Technology and Processing VIII 1991, Vol. 1466, 218-26; Kunz, R. R. et al., Photo-oxidation of σ-conjugated Si—Si network polymers, *J. Vac. Sci Technol. A* May/June 1991, Vol. 9(3) 1447-51; all of which are hereby incorporated herein by reference in their entirety. Specific examples of polysilyne units include units conforming to having R be n-propyl, iso-propyl, n-butyl, iso-butyl, t-butyl, n-hexyl, cyclohexyl, amyl, or phenyl. As well, an exemplary copolymer can utilize two or more types of the polysilyne units previously mentioned (e.g., 70% of the units having R=phenyl and 30% of the units having R=n-hexyl, as taught in U.S. Pat. No. 5,426,160, which is hereby incorporated herein by reference in its entirety).

Another composition that can be utilized with CEL materials includes plasma polymerized organosilicon compositions. In general, these compositions can be photobleachable and can comprise silicon-bearing groups that include organic moieties, with the silicon-bearing groups forming a plurality of silicon-silicon bonds. While not being bound by any particular theory, the silicon-silicon bonding is believed to result in beneficial photobleaching properties. Examples of these types of materials, including synthetic procedures, are described in Horn, M. W. et al, Plasma-deposited organosilicon thin films as dry resists for deep ultraviolet lithography, *J. Vac. Sci. Technol. B* November/December 1990, Vol. 8(6) 1493-1496; Dabbagh, G. et al., Positive Tone Processing of Plasma Polymerized Methylsilane (PPMS), *SPIE*, Vol. 3333 394-400, both of which are hereby incorporated herein by reference in their entirety.

Plasma polymerized organosilicon compositions typically lack a well defined chemical structure. They can be created using a variety of organosilicon containing compounds that are deposited in the presence of a plasma to form an amorphous organosilicon film. For example, an organosilicon containing gas can be emitted in the presence of a plasma for deposition upon a substrate. Non-limiting examples of organosilicon containing compounds that can act as precursors include silanes such as methylsilane (1 to 4 substitutions), hexamethylsilane and tetramethylsilane; silazanes such as hexamethyldisilazane; silylamines such as trimethylsilyldimethylamine; silynes; siloxanes; other silicon-containing molecules (e.g., $Si_2(CH_3)_nH_{6-n}$, where n=1 to 6); and combinations thereof. Such molecules can be cyclic or acylic. In some embodiments, the resulting plasma polymerized film can have a composition according to the formula $Si_wC_xO_yH_z$. In such instances, it can be advantageous to create films where the w:y ratio is made larger, thereby indicating the presence of more Si—Si bonds than Si—O bonds.

In some embodiments, the plasma polymerized organosilicon composition has an oxygen to silicon ratio that is lower than $SiO_2$ in air after the $SiO_2$ has been exposed to an energy fluence of about 3 $J/cm^2$ using actinic radiation (e.g., below about 200 nm wavelength such as about 193 nm or about 157 nm). After exposure to actinic radiation, such compositions may be oxidized such that their oxygen to silicon ratios approach that of the exposed $SiO_2$. In another embodiment, the plasma polymerized organosilicon composition has an oxygen to silicon ratio lower than about 0.3. The low oxygen to silicon ratio can indicate the presence of numerous silicon-silicon bonds, which can be subsequently oxidized upon exposure to actinic radiation, resulting in photobleaching.

Non-polymeric organosilicon containing materials can also be used as a CEL material, consistent with embodiments of the invention. Previous work on polysilane photochemistry demonstrated that the absorptivity of a Si—Si bond drops as the molecular weight of the polymer falls. As supported by the examples discussed herein, however, it is surprisingly found that small, non-polymeric organosilicon containing materials can act as an effective CEL material, having substantial absorptivity of actinic radiation before the onset of photobleaching.

As used throughout the present application, the phrase "non-polymeric" includes all materials that are not considered polymers. Oligomers are one example of a non-polymeric material. As used throughout the present application, "oligomers" are molecules formed from a plurality of repeat units, wherein the number of units is in the range from 2 to 19. The repeat units can be adjacently bonded to one another. As well, like a polymer, the oligomer can utilize two or more distinct repeat units that can be arranged in a variety of manners. Other types of organosilicon containing materials include the range of typical small molecule organosilicon materials such as cyclic or bicyclic silane molecules.

Non-polymeric organosilicon materials can include a backbone comprising silicon atoms that can be contiguously bonded or bonded in fragmented portions. In general, the geometry of the backbone is not limited; in particular embodiments, it can be linear, cyclic (e.g., bicyclic structure), and/or branched (e.g., an oligomer of a polysilyne). In one embodiment, the silicon backbone comprises two or more silicon atoms bonded to form a non-interrupted silicon backbone. For example, the non-interrupted silicon backbone can have a structure given by Structural Formula (IV):

(IV)

wherein each R is independently an organic-containing moiety; and x is an integer in the range of 2 to 19 (inclusive). Each R can be any of the groups as described with respect to Structural Formula (I). The structure of the molecule can include a linear silicon chain, such as appears in an oligomer of a linear polysilane. The structure can also be cyclic such as found in cyclic silanes (e.g., dodecamethylcyclohexasilane). Other types of silicon-containing repeat units can also be used to form non-polymeric organosilicon materials. Non-limiting examples include repeat units such as shown in Structural Formula (IIa) and/or (IIb), having a total number of repeat units to be an oligomer. As well, beyond polysilane-like units, other types of polymeric units can be utilized to form an oligomer such as silazanes, silylamines, silynes, and other silicon-containing molecules. Mixtures of the different types of oligomers can also be utilized. Furthermore, non-polymeric organosilicon materials need not include an oligomer. Indeed, other molecular materials having silicon-silicon bonding such that the molecular structure lacks periodicity can also serve as a non-polymeric organosilicon material.

Other embodiments of the invention are directed to CEL materials that include an organosilicon containing material and an additional polymer composition. Examples of such polymers include poly(methacrylate) polymers such as poly(methylmethacrylate) and poly(t-butylmethacrylate), and poly(acrylate) polymers. In some embodiments, the additional polymer composition does not include substantial silicon-silicon atom bonding in the polymer, and/or does not include silicon atoms anywhere in the polymer, and/or does not have a large absorbance at a particular wavelength or wavelength range of interest (e.g., below 200 nm such as about 193 nm or about 157 nm). For example, the absorption of the polymer composition may be less than about 50%, or less than about 20%, or less than about 10%, of the absorption of the organsilicon containing material either on a basis of the whole CEL composition, or on a weight basis. In general, the polymer composition can act to enhance CEL properties that are unrelated to actinic radiation absorption.

In one embodiment, the additional polymer composition can be formulated with the remaining components of a CEL material to enhance the film forming properties of the CEL (e.g., quicker drying times, striation-free film formation, and/or suppression of cross-linking). Film-forming polymers can be used with any of the organosilicon containing compositions discussed within the present application, such as with particular non-polymeric organosilicon materials to enable film formation of the CEL. As exemplified in the examples discussed herein, CEL formulations using non-polymeric organosilicon materials and film formation enhancing polymers result in a material with surprising, and advantageous photobleaching properties including at short actinic radiation wavelengths (e.g., below 200 nm).

In other embodiments, the additional polymer composition can result in additional, or alternative, CEL property enhancements. In one embodiment, an additional polymer composition can increase or maintain the solubility of a CEL composition being applied and/or being removed. For example, the polymer composition can be used to inhibit cross-linking within the CEL to thereby improve the solubility properties of the CEL composition during CEL removal. As shown in the examples herein, particular CEL components, such as polysilanes, can cross-link after energy exposure at a particular wavelength crosses a particular level. In such an instance, removal of the CEL is inhibited as portions of the CEL can be rendered insoluble by the cross-linking reaction. The addition of a polymer composition can act to elevate the energy exposure level at which cross-linking is initiated. This embodiment can also be applied to other polymers such as polysilynes (e.g., use of a low polarity polymer such as poly(t-butyl methacrylate)), and even the non-polymeric organosilicon composition, the latter perhaps polymerizing and subsequently cross-linking upon extended energy exposure.

In another embodiment, a polymer composition can act to increase the oxygen content of a CEL relative to not having the composition as part of the CEL. For example, the polymer can enhance the amount of alcohol, water, or oxygen in the CEL to act as a source of oxygen to promote oxidation upon activation by actinic radiation. Candidate polymers include hydroxyl or carboxylic acid containing polymers. In another example, the polymer composition can act to increase the water or oxygen permeability of the CEL relative to not having the polymer composition in the CEL. Candidate polymers having favorable oxygen and/or water permeability include polysiloxanes, fluoropolymers, and fluorosiloxane polymers. In an alternative embodiment, the polymer composition can act to inhibit water permeability in the CEL relative to not having the polymer composition present. In such an instance, the polymer composition can act to help prevent water, or some other aqueous solution, in an immersion lithography context from contacting the photoresist.

CEL compositions can also include a variety of other components that provide additional features. Solvents and other components (e.g., viscosity control agents or surfactants) are optionally included to provide properties such as facilitating spin-coating and/or film formation.

EXAMPLES

The following examples are provided to illustrate some embodiments of the invention. In particular, some of the examples provide what is believed to be the first examples of a high performance CEL for use with resists in lithography performed at a wavelength below about 200 nm, providing improved resolution and increased process window. The examples are not intended to limit the scope of any particular embodiment(s) utilized, as some of the CEL materials can also be used at other wavelengths (e.g., about 157 nm), and can be useful in dry or wet lithography.

Experimental Conditions

General Absorbance Measurement Conditions

Fused silica ($SiO_2$) substrates were cleaned by rinsing with acetone followed by rinsing with methanol and air drying. After cleaning, the substrate absorbance was determined by measuring the transmission of the $SiO_2$ at 193 nm. The CEL material solution was spin cast onto $SiO_2$ substrates and post-apply baked at a temperature of 100° C. for 2 minutes on a hot plate. The transmission of the coated substrate was again measured and the absorbance of the coated material calculated by subtracting the substrate absorbance from the total absorbance.

Typically, resist thicknesses in the 100 to 400 nm range were used, which usually yielded initial transmission values at 193 nm between 10 and 90%. The polymer thickness was determined using an ellipsometer. All material absorbances are given on a natural log basis (base e).

General Exposure Conditions

Exposure was performed at 193 nm with a laboratory-class projection system employing an ArF laser. The coated fused silica substrate was exposed to a desired radiation dose, and the transmission of the film measured and the film absorbance determined. This process of exposure followed by transmission measurement was repeated until the desired final total dose was reached. All absorbances were then calculated based on the transmission at a given dose.

General Lithography Process Conditions

The post apply bake (PAB) was performed by placing the silicon wafer on a hot plate for the desired time and at the desired temperature. The post exposure bake (PEB) was performed by placing the silicon wafer on a hot plate for the desired time and at the desired temperature. Development of the photoresist was performed with aqueous tetramethyl-ammonium based commercial resist developers. The clearing dose ($E_0$) is the lowest exposure dose required to remove all resist after development. It was determined by either fitting a line through all points containing less then 80% normalized film thickness as a function of dose and determining the intercept for zero remaining film thickness, or if no slope could be determined, by noting the lowest exposure dose for which no resist remained. The photoresist contrast ($\gamma$) was determined by fitting a line through all points containing less then 80% normalized film thickness as a function of the log of dose and determining the absolute value of the slope. The unexposed film thickness loss (UFTL) was determined by subtracting the film thickness of an unexposed portion of the resist after development from the film thickness of the resist prior to exposure.

The line width resolution was determined by exposing the resist through either a binary or phase shift chrome on a quartz mask containing equal line space features starting at 250 nm and decreasing by 10 nm. The resolution was determined by noting the smallest feature that printed.

General Procedure to Determine Dill A, B, and C Parameters of the Dill Model

The CEL film of interest was coated on a fused quartz disk. The absorbance at 193 nm, before the CEL accumulated energy exposure, was determined and assigned as the Dill A+B value. The disk was exposed to a dosage of 193 nm radiation and the absorbance was again determined. This procedure was repeated a number of times until no change in absorbance was detected. At high accumulated doses, typically 1000 mJ/cm$^2$, the absorbance ceased to change and the final absorbance was assigned as the Dill B value. The Dill A value was determined by subtracting the initial absorbance (Dill A+B) from the final absorbance (Dill B). The Dill C value was determined by employing ProABC software from Finele Technologies to determine the best fit value for the Dill C parameter.

Example 1

Poly(methylmethacrylate) Based CEL

Poly(methylmethacrylate) was purchased from Aldrich Chemical Company. A solution was prepared from 15 parts of poly(methylmethacrylate), and 85 parts of PGMEA by weight. The solution was allowed to roll overnight and was then filtered to 0.2 µm. The solution was coated to 820 nm on a fused silica substrate and baked for 2 minutes on a hot plate. The film was than exposed at varying doses and the absorbance at 193 nm determined. The film absorbance at different exposure doses is shown in Table 2.

TABLE 2

Change in film absorbance at 193 nm

| Exposure Dose (mJ/cm$^2$) | Film Absorbance (µm$^{-1}$) |
|---|---|
| 0 | 0.24 |
| 130 | 0.43 |
| 260 | 0.53 |
| 1000 | 1.25 |

The Dill A parameter was calculated to be $-1.01$ µm$^{-1}$ and the Dill B parameter was calculated to be 0.24 µm$^{-1}$. The change is film absorbance is linear and not exponential therefore no Dill C value was calculated. This material darkens when exposed at 193 nm. The change in absorbance can be subtracted from the absorbance of any photobleachable material contained in a poly(methylmethacrylate) polymer matrix.

Example 2

Dodecamethylcyclohexasilane in poly(methylmethacrylate) Based CEL

Dodecamethylcyclohexasilane (CHS) and poly(methylmethacrylate) were purchased from Aldrich Chemical Company. A solution was prepared from 6 parts of dodecamethylcyclohexasilane, 24 parts of poly(methylmethacrylate), and 170 parts of 2-heptanone by weight. The solution was allowed to roll overnight and was then filtered to 0.2 µm. The solution was coated to 375 nm on a fused silica substrate and baked for 2 minutes on a hot plate. The film was than exposed at varying doses and the absorbance at 193 nm determined. The film absorbance at different exposure doses is shown in Table 3.

TABLE 3

Change in film absorbance at 193 nm

| Exposure Dose (mJ/cm$^2$) | Film Absorbance (µm$^{-1}$) |
|---|---|
| 0 | 7.03 |
| 25 | 3.91 |
| 50 | 4.11 |
| 75 | 4.00 |
| 130 | 2.97 |
| 200 | 3.02 |
| 260 | 2.52 |
| 300 | 2.23 |
| 400 | 1.52 |
| 750 | 1.44 |
| 1000 | 1.30 |

The Dill A parameter was calculated to be 6.53 µm$^{-1}$ and the Dill B parameter was calculated to be 0.30 µm$^{-1}$. The best fit Dill C parameter was 0.014 cm$^2$/mJ. This material has significant bleaching at 193-nm and is expected to a superior CEL.

Example 3

90:10 Poly(n-propyl-co-iso-butylsilyne) Based CEL

Poly(n-propyl-co-iso-butylsilyne) (PPSBS) was prepared to yield a 90:10 monomer ration of propylsilyne to iso-butylsilyne. The PPSBS was prepared in accordance with the method described in Bianconi, P. et al., *J.A.C.S.* 1988, Vol. 110 2342, which is hereby incorporated herein by reference in its entirety. A solution was prepared from 15 parts poly(n-propyl-co-iso-butylsilyne) and 85 parts of toluene by weight. The solution was allowed to roll overnight and was then filtered to 0.2 µm. The solution was coated to 118 nm on a fused silica substrate and baked for 2 minutes on a hot plate. The film was than exposed at varying doses and the absorbance at 193 nm determined after each dose. The film absorbance at different exposure doses is shown in Table 4.

TABLE 4

Change in film absorbance at 193 nm

| Exposure Dose (mJ/cm$^2$) | Film Absorbance (µm$^{-1}$) |
|---|---|
| 0 | 11.80 |
| 25 | 8.42 |
| 50 | 4.70 |
| 75 | 3.38 |
| 100 | 2.67 |
| 150 | 1.51 |
| 200 | 1.00 |
| 1000 | 0.42 |

The Dill A parameter was calculated to be 11.38 µm$^{-1}$ and the Dill B parameter was calculated to be 0.42 µm$^{-1}$. The best fit Dill C parameter was 0.027 cm$^2$/mJ. This material has significant bleaching at 193 nm and is expected to a superior CEL.

Example 4

Poly(methylmethacrylate) Based CEL

Poly(t-butylmethacrylate) was purchased from Aldrich Chemical Company. A solution was prepared from 7 parts poly(t-butylmethacrylate) and 93 parts of xylenes by weight. The solution was allowed to roll overnight and was then filtered to 0.2 µm. The solution was coated to 240 nm on a fused silica substrate and baked for 2 minutes on a hot plate. The film was than exposed at varying doses and the absorbance at 193 nm determined after each dose. The film absorbance at different exposure doses is shown in Table 5.

TABLE 5

Change in film absorbance at 193 nm

| Exposure Dose (mJ/cm$^2$) | Film Absorbance (µm$^{-1}$) |
|---|---|
| 0 | 0.36 |
| 100 | 0.26 |
| 200 | 0.23 |
| 400 | 0.23 |
| 1000 | 0.27 |

The Dill A parameter was calculated to be 0.09 µm$^{-1}$ and the Dill B parameter was calculated to be 0.27 µm$^{-1}$. Little change is film absorbance observed and the change is not exponential therefore no Dill C value was calculated. This material has slight initial bleaching at 193 nm followed by slight darkening. The change in absorbance with dose can be subtracted from the absorbance of a photobleachable material contained in a poly(t-butylmethacrylate) polymer matrix.

Example 5

Dodecamethylcyclohexasilane in poly(t-butylmethacrylate) Based CEL

Dodecamethylcyclohexasilane (CHS) and poly(t-butylmethacrylate) were purchased from Aldrich Chemical Company. A solution was prepared from 9 parts of dodecamethylcyclohexasilane, 21 parts of poly(methylmethacrylate), and 400 parts of xylenes by weight. The solution was allowed to roll overnight and then filtered to 0.2 µm. The solution was coated to 240 nm on a fused silica substrate and baked for 2 minutes on a hot plate. The film was than exposed at varying doses and the absorbance at 193 nm determined. The film absorbance at different exposure doses is shown in Table 6.

TABLE 6

Change in film absorbance at 193 nm

| Exposure Dose (mJ/cm$^2$) | Film Absorbance (µm$^{-1}$) |
|---|---|
| 0 | 11.12 |
| 25 | 8.05 |
| 50 | 5.76 |
| 100 | 3.68 |
| 150 | 2.37 |
| 200 | 1.65 |
| 400 | 0.54 |
| 700 | 0.42 |
| 1000 | 0.41 |

The Dill A parameter was calculated to be 10.17 µm$^{-1}$ and the Dill B parameter was calculated to be 0.41 µm$^{-1}$. The best fit Dill C parameter was 0.032 cm$^2$/mJ. This material has significant bleaching at 193-nm and is expected to a superior CEL.

Example 6

Poly(cyclohexylsilyne) Based CEL

Poly(cyclohexylsilyne) (PCHS) was prepared following the method described in Thomes, W. J. et al., *J. Appl. Phys.* 2004, 96 6313, which is hereby incorporated herein by reference in its entirety. A solution was prepared from 4 parts poly(n-propyl-co-iso-butylsilyne) and 96 parts of toluene by weight. The solution was allowed to roll overnight and was then filtered to 0.2 µm. The solution was coated to 55 nm on a fused silica substrate and baked for 2 minutes on a hot plate. The film was than exposed at varying doses and the absorbance at 193 nm determined after each dose. The film absorbance at different exposure doses is shown in Table 7.

TABLE 7

Change in film absorbance at 193 nm

| Exposure Dose (mJ/cm$^2$) | Film Absorbance (µm$^{-1}$) |
|---|---|
| 0 | 15.34 |
| 10 | 14.21 |
| 20 | 13.05 |

TABLE 7-continued

Change in film absorbance at 193 nm

| Exposure Dose (mJ/cm$^2$) | Film Absorbance (µm$^{-1}$) |
|---|---|
| 30 | 12.11 |
| 50 | 11.41 |
| 100 | 8.44 |
| 150 | 6.26 |
| 200 | 4.91 |
| 300 | 2.74 |
| 500 | 1.76 |
| 1000 | 1.36 |

The Dill A parameter was calculated to be 13.97 µm$^{-1}$ and the Dill B parameter was calculated to be 1.36 µm$^{-1}$. The best fit Dill C parameter was 0.008 cm$^2$/mJ. This material has significant bleaching at 193 nm and is expected to a superior CEL.

Example 7

Photoresist Contrast Curve with Dodecamethylcyclohexasilane in poly(t-butylmethacrylate) Based CEL Dodecamethylcyclohexasilane and poly(t-butylmethacrylate) were purchased from Aldrich Chemical Company. A solution was prepared from 9 parts of dodecamethylcyclohexasilane, 21 parts of poly(methylmethacrylate), and 400 parts of xylenes by weight. The solution was allowed to roll overnight and was then filtered to 0.2 µm.

A silicon wafer was coated with a 287 nm thick film of Rohm and Haas XP-5193Z 193 nm resist and then PAB baked at 100° C. for 90 seconds. The resist was bulk exposed with a variety of different exposure doses with 193 nm radiation and PEB baked at 100° C. for 60 seconds. The resist was developed in Rohm and Haas LDD-26W developer for 40 seconds and the remaining resist thickness determined at different doses.

A second silicon wafer was coated to a 287 nm thick film of Rohm and Haas XP-5193Z 193-nm resist and then PAB baked at 100° C. for 90 seconds. The wafer was then coated with a 235 nm thick film of the dodecamethylcyclohexasilane in poly(t-butylmethacrylate) based CEL and baked again to 100° C. for 60 seconds. The combination of CEL thickness and absorbance gave an optical density (OD) of 2.61, the OD being the product of the total film absorbance and film thickness. The CEL coated resist was bulk exposed with a variety of different exposure doses with 193 nm radiation. The CEL was removed by immersion in xylenes for 10 seconds and then the resist was PEB baked at 100° C. for 60 seconds. The resist was developed in Rohm and Haas LDD-26W developer for 40 seconds and the remaining resist thickness determined at different doses. The clearing dose ($E_0$), contrast, and unexposed film thickness loss were determined for both wafers and results are shown in Table 8.

TABLE 8

Lithographic properties of resist with and without CEL at 193 nm

| | XP-5193Z | XP-5193Z + 2.6 OD CEL |
|---|---|---|
| $E_0$ (mJ/cm$^2$) | 9.2 | 44.1 |
| Contrast | 24.9 | 44.0 |
| UFTL (nm) | 5.7 | 2.5 |

The results show that as expected the use of a CEL decreases resist sensitivity. The results also show that resist contrast is increased with the use of a CEL. Finally, the results show that there is little change in UFTL which shows that the addition of a CEL coat and removal step did not lead to any significant change in resist thickness, implying no CEL intermixing or resist removal with the xylenes CEL strip. The results also show that the dodecamethylcyclohexasilane can removed with organic solvents and has not undergone significant crosslinking which would render the dodecamethylcyclohexasilane insoluble.

Example 8

Contrast Curve with Poly(cyclohexylsilyne) Based CEL

Poly(cyclohexylsilyne) was prepared by the method of Casadonte as referred to above. A solution was prepared from 4 parts poly(n-propyl-co-iso-butylsilyne) and 96 parts of toluene by weight. The solution was allowed to roll overnight and was then filtered to 0.2 µm.

A silicon wafer was coated with a 282 nm thick film of Rohm and Haas XP-5193Z 193 nm resist, and then PAB baked at 100° C. for 90 seconds. The resist was bulk exposed with a variety of different exposure doses with 193 nm radiation and PEB baked at 100° C. for 60 seconds. The resist was developed in Rohm and Haas LDD-26W developer for 40 seconds and the remaining resist thickness determined at different doses.

A second silicon wafer was coated to a 282 nm thick film of Rohm and Haas XP-5193Z 193 nm resist and then PAB baked at 100° C. for 90 seconds. The wafer was then coated with a 106 nm thick film of the poly(cyclohexylsilyne) based CEL and baked again to 100° C. for 60 seconds. The combination of CEL thickness and absorbance gave an optical density (OD) of 1.63. The CEL coated resist was bulk exposed with a variety of different exposure doses with 193 nm radiation. The CEL was removed by immersion in xylenes for 10 seconds and then the resist was PEB baked at 100° C. for 60 seconds. The resist was developed in Rohm and Haas LDD-26W developer for 40 seconds and the remaining resist thickness determined at different doses.

A third silicon wafer was coated to a 282 nm thick film of Rohm and Haas XP-5193Z 193 nm resist and then PAB baked at 100° C. for 90 seconds. The wafer was then coated with a 163 nm thick film of the poly(cyclohexylsilyne) based CEL and baked again to 100° C. for 60 seconds. The combination of CEL thickness and absorbance will give an optical density (OD) of 2.50. The CEL coated resist was bulk exposed with a variety of different exposure doses with 193-nm radiation. The CEL was removed by immersion in xylenes for 10 seconds and then the resist was PEB baked at 100° C. for 60 seconds. The resist was developed in Rohm and Haas LDD-26W developer for 40 seconds and the remaining resist thickness determined at different doses. The clearing dose ($E_0$), contrast, and unexposed film thickness loss were determined for all three wafers and results are shown in Table 9.

TABLE 9

Lithographic properties of resist with and without CEL at 193 nm

|  | XP-5193Z | XP-5193Z + 1.6 OD CEL | XP-5193Z + 2.5 OD CEL |
|---|---|---|---|
| $E_0$ (mJ/cm$^2$) | 7.3 | 20.2 | 46.7 |
| Contrast | 25.6 | 16.1 | 29.9 |
| UFTL (nm) | 2.2 | 1.8 | −0.5 |

The results show that as expected the use of a CEL decreases resist sensitivity. The results also show that resist contrast is increased or remains very high with the use of a CEL. Finally, the results show that there is little change in UFTL, which indicates that the addition of a CEL coat and removal step did not lead to significant change in resist thickness implying no CEL intermixing or resist removal with the xylenes CEL strip. The results also show that the poly(cyclohexylsilyne) can be removed with organic solvents and has not undergone significant crosslinking which would render the poly(cyclohexylsilyne) insoluble.

Comparative Example 9

Dill A, B, and C Parameters for Various Materials at 193 nm

The Dill A, B, and C values for the following materials were determined with 193 nm exposure. The following diazo-containing materials were prepared via literature methods: 2-diazocyclododecane-1-one (DDK), 1-adamantan-1-yl-2-diazo-ethanone (ADK), 1,7,7-trimethyl-3-diazo-bicyclo[2.2.1]heptan-2-one (CDK), 2,2-Dimethyl-4-diazo-[1,3]dioxane-4,6-dione (DMA), and 1,5-Dioxa-spiro[5,5]undecane-3-diazo-2,4-dione (DMCH). The 20% diazo containing CELs were prepared by adding 1 part of the diazo-containing material to 4 parts of a fluorocarbon polymer and 45, parts of ethyl lactate by weight. The 30% diazo containing CELs were prepared by adding 1.5 parts of the diazo-containing material to 3.5 parts of a fluorocarbon polymer and 45, parts of ethyl lactate by weight. The 40% diazo containing CELs were prepared by adding 2 parts of the diazo-containing material to 3 parts of a fluorocarbon polymer and 45 of parts of ethyl lactate by weight. Films were spin cast on a fused silica substrate allowed to air dry overnight. The absorbance at different exposure doses was determined and the Dill A, B, and C values calculated. These values are compared to previously determined values of silane and silyne containing CELs in Table 10.

TABLE 10

Comparison of Dill A, B, and C parameters of diazo, silane and silyne containing CEL.

| Photoactive material | Photoactive material (wt %) | Dill A (µm$^{-1}$) | Dill B (µm$^{-1}$) | Dill C (cm$^2$/mJ) |
|---|---|---|---|---|
| DDK | 20 | 0.40 | 1.19 | 0.011 |
| CDK | 20 | −0.29 | 0.97 | 0.010 |
| ADK | 20 | 0.29 | 2.03 | 0.024 |
| DMA | 20 | 1.51 | 0.32 | 0.021 |
| DMA | 30 | 1.59 | 0.42 | 0.021 |
| DMA | 40 | 1.40 | 0.45 | 0.021 |
| DMCH | 20 | 1.28 | 0.61 | 0.013 |
| DMCH | 30 | 1.89 | 0.90 | 0.019 |
| DMCH | 40 | 2.24 | 1.07 | 0.023 |
| CHS | 20 | 6.53 | 0.30 | 0.014 |
| CHS | 30 | 10.71 | 0.41 | 0.032 |
| PPSBS | 100 | 11.38 | 0.42 | 0.027 |
| PCHS | 100 | 13.97 | 1.36 | 0.008 |

The results shown that diazo-containing materials will not perform as good CELs employing 193-nm lithography. The Dill A is too low to provide for a sufficient level of photobleaching with 193 nm exposure. In comparison the Dill A values for the silane and silyne based CELs is much greater and will provide for a sufficient level of photobleaching with 193 nm exposure. These results show the superiority of silane and silyne based CELs for 193-nm lithography.

Comparative Example 10

Dill A, B, and C Parameters for Various Materials at 193 nm

The Dill A, B, and C values for the following materials was determined with 193-nm exposure. The following diazido-containing materials were purchased from Toyo Gosei Company, Ltd.: 2,6-di-(4-azidobenzylidene)-4-methylcyclohexanone (BAC-M) and 4-4'-diazidostilbene sodium sulfonate (DazST-Na). The 20% BAC-M containing CEL was prepared by adding 1 part of the BAC-M to 4 parts of a fluorocarbon polymer and 45 of parts of ethyl lactate by weight. The 20% DazST-Na containing CEL was prepared by adding 1 part of the DazST-Na to 4 parts of a polyacrylic acid and 45 of parts of water by weight. Films were spin cast on a fused silica substrate allowed to air dry overnight. The absorbance at different exposure doses was determined and the Dill A, B, and C values calculated. These values are compared to previously determined values of silane and silyne containing CELs in Table 11.

TABLE 11

Comparison of Dill A, B, and C parameters of diazid, silane and silyne containing CELs

| Photoactive material | Photoactive material (%) | Dill A ($\mu m^{-1}$) | Dill B ($\mu m^{-1}$) | Dill C ($cm^2/mJ$) |
|---|---|---|---|---|
| BAC-M | 20 | 0.40 | 5.52 | NA |
| DazST-Na | 20 | 0.84 | 3.06 | NA |
| CHS | 20 | 6.53 | 0.30 | 0.014 |
| CHS | 30 | 10.71 | 0.41 | 0.032 |
| PPSBS | 100 | 11.38 | 0.42 | 0.027 |
| PCHS | 100 | 13.97 | 1.36 | 0.008 |

The results shown that diazido-containing materials will not perform as good CELs employing 193 nm lithography. The Dill A is too low to provide for a sufficient level of photobleaching with 193 nm exposure. In addition, the Dill B is too high and as such will give an unacceptable level of residual absorbance in the exposed film. The very high level of Dill B did not allow for the determination of the Dill C value. In comparison the Dill A values for the silane and silyne based CELs is much greater and will provide for a sufficient level of photobleaching with 193 nm exposure. These results show the superiority of silane and silyne based CELs for 193 nm lithography.

Example 11

Lithographic Process Latitude with Dodecamethylcyclohexasilane in poly(t-butylmethacrylate) Based CEL This example provides comparative data regarding the process window for three different photoresist systems. A process window defines the range of exposure latitude and focus latitude of a lithographic system while operating within an designated range of line width resolution variation; the greater the latitudes, the greater the tolerance that a process has to achieve a given line width resolution.

For this example, starting with the optimal focus latitude at a given energy exposure dosage to produce a nominally 90 nm half width pitch line on a photoresist, the focus latitude is changed in steps of 0.1 µm until the line width varies by more than 10% from a 90 nm half width pitch line. The number of steps in which the range of line width variation is achieved defines the focus latitude at the given energy exposure dosage level. Next, another dosage of energy is utilized and the focus latitude is varied again to determine the focus latitude at the new dosage level. These steps are repeated to find the focus latitude at each energy dosage level. From this data, the exposure latitude at a given focus latitude can be obtained. The exposure latitude is defined as the range of energy doses measured that provide the nominally 90 nm half width pitch line on a photoresist system within ±10% at a given focus latitude, divided by the average of the highest and lowest exposure dosages that provide the desired half width pitch line size within ±10%. at the given focus latitude CEL material: Dodecamethylcyclohexasilane and poly(t-butylmethacrylate) were purchased from Aldrich Chemical Company. A solution was prepared from 9 parts of dodecamethylcyclohexasilane, 21 parts of poly(methylmethacrylate), and 400 parts of xylenes by weight. The solution was allowed to roll overnight and was then filtered to 0.2 µm.

Photoresist System 1: A silicon wafer was coated with a 77 nm thick film of Brewer Science ARC29A and than baked at 205° C. for 60 seconds. The wafer was next coated to 220 nm thick film of Arch GAR 8105G1 193 nm resist and then PAB baked at 115° C. for 90 seconds. The resist was exposed with a variety of different exposure doses at difference focus positions with 193 nm radiation and PEB baked at 115° C. for 90 seconds. The resist was developed in Arch OPD26W developer for 60 seconds with a single puddle. The line width of nominally 90-nm half pitch lines were measured as a function of exposure dose and focus position.

Photoresist System 2: A second silicon wafer was coated to a 77=n thick film of Brewer Science ARC29A and than baked at 205° C. for 60 seconds. The wafer was next coated to 220 nm thick film of Arch GAR 8105G1 193 nm resist and then PAB baked at 115° C. for 90 seconds. The wafer was then coated with a 135-m thick film of the dodecamethylcyclohexasilane in poly(t-butylmethacrylate) based CEL and baked again to 100° C. for 60 seconds. The combination of CEL thickness and absorbance will give an optical density (OD) of 1.50. The resist was exposed with a variety of different exposure doses at difference focus positions with 193-nm radiation. The CEL was removed by immersion in xylenes for 10 seconds and then PEB baked at 115° C. for 90 seconds. The resist was developed in Arch OPD26W developer for 60 seconds with a single puddle. The linewidth of nominally 90 nm half pitch lines were measured as a function of exposure dose and focus position.

Photoresist System 3: A third silicon wafer was coated to a 77 nm thick film of Brewer Science ARC29A and than baked at 205° C. for 60 seconds. The wafer was next coated to 220 nm thick film of Arch GAR 8105G1 193 nm resist and then PAB baked at 115° C. for 90 seconds. The wafer was then coated with a 225 nm thick film of the dodecamethylcyclohexasilane in poly(t-butylmethacrylate) based CEL and baked again to 100° C. for 60 seconds. The combination of CEL thickness and absorbance will give an optical density (OD) of 2.50. The resist was exposed with a variety of different exposure doses at difference focus positions with 193 nm radiation. The CEL was removed by immersion in xylenes for 10 seconds and then PEB baked at 115° C. for 90 seconds. The resist was developed in Arch OPD26W developer for 60 seconds with a single puddle. The linewidth of nominally 90 nm half pitch lines were measured as a function of exposure dose and focus position.

Figure 3:
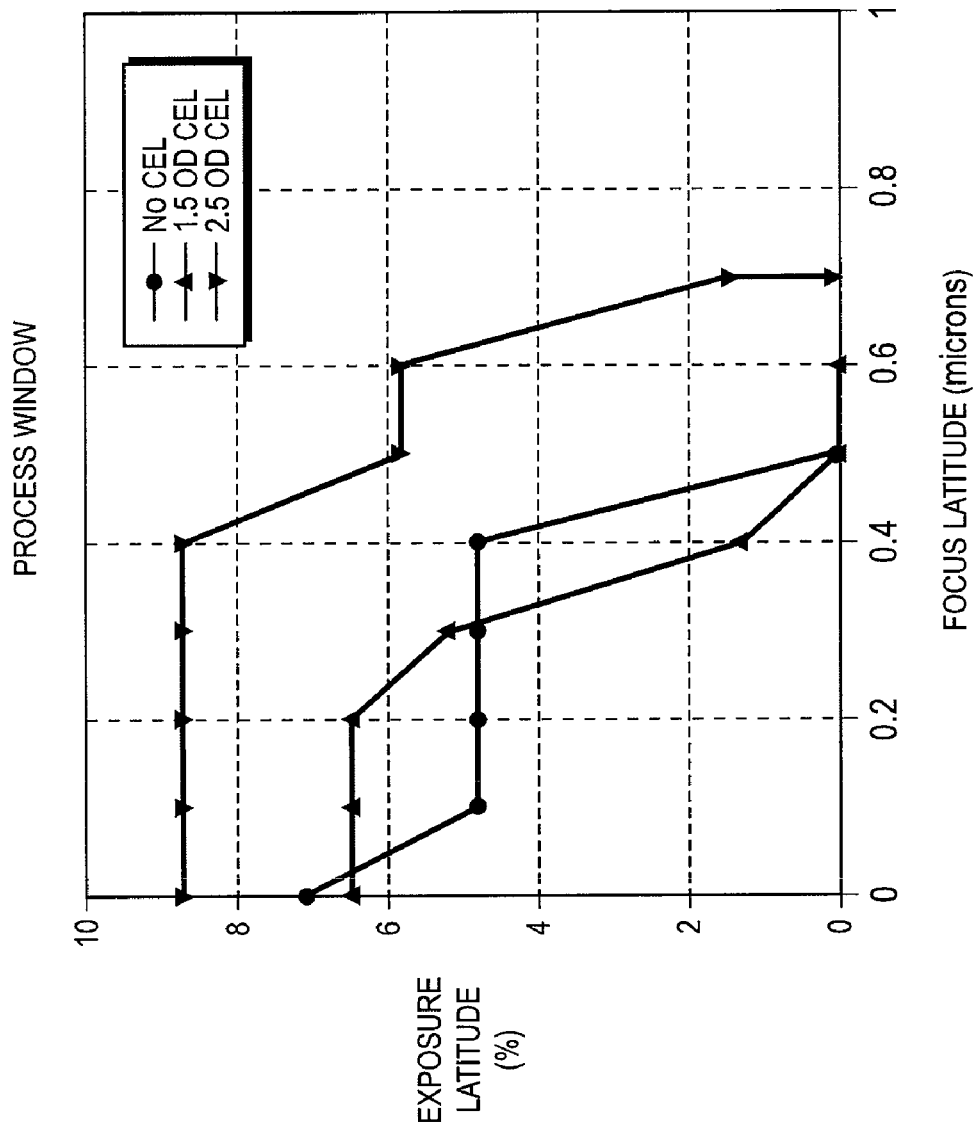
FIG. 3 depicts a graph of exposure latitude versus focus latitude for three different mask compositions: a photoresist composition; the photoresist composition underlying a contrast enhancing layer having an optical density of about 1.5; and the photoresist composition underlying a contrast enhancing layer having an optical density of about 2.5.

The process window data for GAR 8105G1 without a CEL, with a 1.5 OD cell, and with a 2.5 OD cell are shown in Table 12. In particular, the percentages in Table 12 correspond with the exposure latitudes at the given focus latitude. Blank spaces in the table are where no exposure dose gave the desired half pitch line width range. The data is also plotted as a graph of exposure latitude percentage versus focus latitude in microns in FIG. 3.

TABLE 12

Lithographic process window data of mask compositions for 90-nm half pitch line at 193 nm

| Focus Latitude (μm) | GAR 8105G1 (no CEL) | GAR 8105G1 + 1.5 OD CEL | GAR 8105G1 + 2.5 OD CEL |
|---|---|---|---|
| 0.0 | 7.1% | 6.5% | 8.7% |
| 0.1 | 4.8% | 6.5% | 8.7% |
| 0.2 | 4.8% | 6.5% | 8.7% |
| 0.3 | 4.8% | 5.2% | 8.7% |
| 0.4 | 4.8% | 1.3% | 8.7% |
| 0.5 | 0.0% | 0.0% | 5.8% |
| 0.6 |  | 0.0% | 5.8% |
| 0.7 |  |  | 1.4% |

The results show that both the high and low OD cell material have an improved lithographic process window relative to the resist with no CEL. The resist with the 1.5 OD CEL has an 0.1 μm higher focus latitude than the resist without a CEL. The resist with the 1.5 OD CEL also showed a depth of focus of 0.3 μm with a 5% or greater focus latitude while the resist without a CEL had only a depth of focus of 0.0 μm with a 5% or greater focus latitude. The resist with the 2.5 OD CEL has an 0.2 μm higher focus latitude than the resist without a CEL. The resist with the 2.5 OD CEL also showed a depth of focus of 0.6 μm with a 5% or greater focus latitude while the resist without a CEL had only a depth of focus of 0.0 μm with a 5% or greater focus latitude. Thus the use of the dodecamethylcyclohexasilane based CEL shows a significant lithographic improvement in process window relative to not using a CEL.

Example 12

Dodecamethylcyclohexasilane in poly(t-butylmethacrylate) Based CEL

Dodecamethylcyclohexasilane (CHS) and poly(t-butylmethacrylate) were purchased from Aldrich Chemical Company. A solution was prepared from 9 parts of dodecamethylcyclohexasilane, 21 parts of poly(t-butylmethacrylate), and 400 parts of xylenes. The solution was allowed to roll overnight and was then filtered to 0.2 μm. The solution was coated to 240 nm on a fused silica substrate and baked for 2 minutes on a hot plate. The film was than exposed at varying doses, and the absorbance at 248 nm determined. The film absorbance at different exposure doses is shown in Table 13.

TABLE 13

Change in film absorbance at 248 nm

| Exposure Dose (mJ/cm$^2$) | Film Absorbance (μm$^{-1}$) |
|---|---|
| 0 | 0.625 |
| 25 | 0.613 |
| 50 | 0.509 |
| 100 | 0.451 |
| 150 | 0.510 |
| 200 | 0.361 |

TABLE 13-continued

Change in film absorbance at 248 nm

| Exposure Dose (mJ/cm$^2$) | Film Absorbance (μm$^{-1}$) |
|---|---|
| 400 | 0.210 |
| 700 | 0.142 |
| 1000 | 0.056 |

The Dill A parameter was calculated to be 0.570 μm$^{-1}$ and the Dill B parameter was calculated to be 0.056 μm$^{-1}$. The best fit Dill C parameter was 0.003 cm$^2$/mJ. This material has significant bleaching at 248 nm and is expected to a superior CEL. The material is also shown, by the various Examples herein, to have CEL properties at multiple wavelengths.

While the present invention has been described in terms of specific methods, structures, and devices it is understood that variations and modifications will occur to those skilled in the art upon consideration of the present invention. For example, the methods and compositions discussed herein can be utilized beyond lithography for electronic materials production. As well, the features illustrated or described in connection with one embodiment may be combined with the features of other embodiments. Such modifications and variations are intended to be included within the scope of the present invention. Those skilled in the art will appreciate, or be able to ascertain using no more than routine experimentation, further features and advantages of the invention based on the above-described embodiments. Accordingly, the invention is not to be limited by what has been particularly shown and described, except as indicated by the appended claims. All publications and references are herein expressly incorporated by reference in their entirety.

What is claimed is:

1. A method of enhancing the image contrast of a pattern formed on a photoresist, comprising:
    forming a photoresist layer on a substrate, the photoresist layer capable of being patterned by radiation having a wavelength below about 200 nm;
    forming a contrast enhancing layer (CEL) coupled to the photoresist layer, the CEL comprising an organosilicon containing material that is photobleachable by exposure to the radiation; and
    exposing an image pattern on a surface of the CEL with actinic radiation having a wavelength below about 200 nm to thereby bleach the CEL, and form a corresponding pattern on the photoresist layer with enhanced image contrast relative to directly exposing the actinic radiation image pattern on the photoresist layer.

2. The method of claim 1, further comprising:
    removing the CEL after exposing the image pattern.

3. The method of claim 1, wherein the step of exposing the image pattern further comprises exposing the image pattern on the surface of the CEL while the surface is covered with a liquid composition.

4. The method of claim 1, wherein the CEL inhibits contact between the liquid composition and the photoresist layer.

5. The method of claim 1, wherein the CEL comprises a polysilane capable of being photobleached by exposure to the radiation.

6. The method of claim 5, wherein the CEL is characterized by a Dill A parameter having a value greater than about 3.0 μm$^{-1}$ when the CEL is exposed to actinic radiation having a wavelength below about 200 nm.

7. The method of claim 5, wherein the CEL is characterized by a Dill B parameter having a value less than about $3.0 \,\mu m^{-1}$ when the CEL is exposed to actinic radiation having a wavelength below about 200 nm.

8. The method of claim 5, wherein the polysilane comprises a plurality of units represented by the following structural formula:

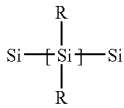

wherein each R is independently an organic moiety.

9. The method of claim 8, wherein R is an aliphatic or aromatic organic moiety, the organic moiety being either substituted or unsubstituted.

10. The method of claim 9, wherein the organic moiety is substituted with at least one of acetal, acyl halide, alcohol, aldehyde, alkane, alkene, alkoxy, alkyne, amide, amine, ammonium, arene, azide, heteroarene, azide, carboxylic acid, disulfide, epoxide, ester, ether, fluoroalcohol, halide, hydroxyl, ketal, ketone, nitrile, nitro, phenol, phosphate, a phosphonate, a phosphinate, sulfide, sulfone, sulfonic acid, sulfonic ester, sulfoxide, silane, silyne, siloxane, thioester, thioketone, and thiol.

11. The method of claim 8, wherein R is a substituted or unsubstituted aliphatic organic moiety.

12. The method of claim 11, wherein R is a substituted or unsubstituted fluoroaliphatic organic moiety.

13. The method of claim 8, wherein R includes an acid labile protecting group.

14. The method of claim 8, wherein R includes an unsubstituted aliphatic organic moiety having 1 to 20 carbon atoms.

15. The method of claim 14, wherein R includes at least one unsubstituted aliphatic group, the unsubstituted aliphatic group being selected from a group consisting of methyl, ethyl, propyl, butyl, pentyl, hexyl, heptyl, octyl, decyl, dodecyl, and tetradecyl.

16. The method of claim 8, wherein R includes a substituted or unsubstituted carbocyclic aromatic group.

17. The method of claim 16, wherein the carbocyclic aromatic group includes at least one of phenyl, benzyl, tolyl, naphthyl, and anthracyl.

18. The method of claim 1, wherein the CEL comprises a polysilyne capable of being photobleached by exposure to the radiation.

19. The method of claim 18, wherein the polysilyne includes a plurality of units represented by the following structural formula:

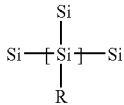

wherein each R is independently an organic moiety.

20. The method of claim 19, wherein R includes an aliphatic or aromatic organic moiety, the organic moiety being either substituted or unsubstituted.

21. The method of claim 20, wherein the organic moiety is substituted with at least one of acetal, acyl halide, alcohol, aldehyde, alkane, alkene, alkoxy, alkyne, amide, amine, ammonium, arene, azide, heteroarene, azide, carboxylic acid, disulfide, epoxide, ester, ether, fluoroalcohol, halide, hydroxyl, ketal, ketone, nitrile, nitro, phenol, phosphate, a phosphonate, a phosphinate, sulfide, sulfone, sulfonic acid, sulfonic ester, sulfoxide, silane, silyne, siloxane, thioester, thioketone, and thiol.

22. The method of claim 20, wherein R includes a substituted or unsubstituted aliphatic organic moiety.

23. The method of claim 22, wherein R includes an unsubstituted aliphatic organic moiety having 1 to 20 carbon atoms.

24. The method of claim 23, wherein R includes at least one unsubstituted aliphatic group, the unsubstituted aliphatic group being selected from a group consisting of methyl, ethyl, propyl, butyl, pentyl, hexyl, heptyl, octyl, decyl, dodecyl, and tetradecyl.

25. The method of claim 22, wherein R is a substituted or unsubstituted fluoroaliphatic organic moiety.

26. The method of claim 20, wherein R includes a substituted or unsubstituted carbocyclic aromatic group.

27. The method of claim 26, wherein the carbocyclic aromatic group includes at least one of phenyl, benzyl, tolyl, naphthyl, and anthracyl.

28. The method of claim 19, wherein R includes an acid labile protecting group.

29. The method of claim 19, wherein at least one unit of the polysilyne includes a first organic moiety and at least one unit includes a second organic moiety. the first and second organic moieties not being the same.

30. The method of claim 18, wherein the polysilyne is a copolymer.

31. The method of claim 18, wherein the polysilyne includes at least one of propylsilyne units, butylsilyne units, hexylsilyne units, amylsilyne units, and phenylsilyne units.

32. The method of claim 18, wherein the polysilyne includes at least one of a poly(iso-butylsilyne) and a poly (cyclohexylsilyne).

33. The method of claim 18, wherein the CEL is characterized by a Dill A parameter having a value greater than about $3.0 \,\mu m^{-1}$ when the CEL is exposed to actiic radiation having a wavelength below about 200 nm.

34. The method of claim 18, wherein the CEL is characterized by a Dill B parameter having a value less than about $3.0 \,\mu m^{-1}$ when the CEL is exposed to actinic radiation having a wavelength below about 200 nm.

35. The method of claim 18, comprising:
a polymer composition for decreasing cross linking in the CEL relative to not having the polymer composition present in the CEL.

36. The method of claim 1, wherein the CEL comprises a plasma polymerized organosilicon composition capable of being photobleached by exposure to the radiation.

37. The method of claim 36, wherein the step of forming the CEL includes depositing the organosilicon containing material in the presence of a plasma to form the plasma polymerized organosilicon composition.

38. The method of claim 36, wherein the plasma polymerized organosilicon composition comprises an oxygen to silicon ratio lower than that of $SiO_2$ in air when the $SiO_2$ is exposed to an energy fluence of about 3 J/cm$^2$.

39. The method of claim 38, wherein the plasma polymerized organosilicon composition includes an oxygen to silicon ratio lower than about 0.3.

40. The method of claim 36, wherein the plasma polymerized organosilicon composition comprises at least one of a plasma polymerized silane, a plasma polymerized silazane, a plasma polymerized silyne, and a plasma polymerized silylamine.

41. The method of claim 1, wherein the CEL comprises a non-polymeric organosilicon composition capable of being photobleached by exposure to the radiation and a polymer composition for enhancing film formation.

42. The method of claim 41, wherein the non-polymeric organosilicon composition comprises a plurality of silicon atoms.

43. The method of claim 42, wherein at least a portion of the non-polymeric organosilicon composition comprises a molecule with units according to the following structural formula:

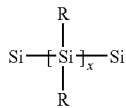

wherein each R is independently an organic moiety, and x is an integer in the range of 2 to 19.

44. The method of claim 43, wherein the non-polymeric organosilicon composition includes a linear silicon chain.

45. The method of claim 43, wherein the non-polymeric organosilicon composition includes a cyclic silicon chain.

46. The method of claim 41, wherein the non-polymeric organosilicon composition includes dodecamethylcyclohexasilane.

47. The method of claim 41, wherein the polymer composition includes at least one of a poly(methacrylate) polymer and poly(acrylate) polymer.

48. The method of claim 41, wherein the polymer composition includes at least one of siloxane polymers, fluoropolymers, and fluorosiloxane polymers.

49. The method of claim 1, wherein the CEL comprises: a polymer composition for enhancing film formation.

50. The method of claim 1, wherein the CEL comprises: a polymer composition for inhibiting cross-linking within the CEL.

51. The method of claim 1, wherein the actinic radiation comprises radiation having a wavelength of about 193 nm.

52. The method of claim 1, wherein the actinic radiation comprises radiation having a wavelength of about 157 nm.

53. The method of claim 1, wherein the step of exposing the image pattern includes bleaching the CEL such that film absorbance of the CEL decreases by at least about 3 $\mu m^{-1}$ through a thickness of the CEL.

* * * * *

UNITED STATES PATENT AND TRADEMARK OFFICE
CERTIFICATE OF CORRECTION

PATENT NO. : 7,622,246 B2
APPLICATION NO. : 11/534347
DATED : November 24, 2009
INVENTOR(S) : Theodore H. Fedynyshyn It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 308 days.

Signed and Sealed this

Twenty-sixth Day of October, 2010

David J. Kappos
*Director of the United States Patent and Trademark Office*